(12) United States Patent
Otremba (10) Patent No.: US 7,898,080 B2
(45) Date of Patent: Mar. 1, 2011

(54) POWER SEMICONDUCTOR DEVICE COMPRISING A SEMICONDUCTOR CHIP STACK AND METHOD FOR PRODUCING THE SAME

(75) Inventor: Ralf Otremba, Kaufbeuren (DE)

(73) Assignee: Infineon Technologies AG, Munich (DE)

( * ) Notice: Subject to any disclaimer, the term of this patent is extended or adjusted under 35 U.S.C. 154(b) by 133 days.

(21) Appl. No.: 11/464,958

(22) Filed: Aug. 16, 2006

(65) Prior Publication Data
US 2007/0040260 A1 Feb. 22, 2007

(30) Foreign Application Priority Data
Aug. 18, 2005 (DE) .................. 10 2005 039 478

(51) Int. Cl.
*H01L 23/488* (2006.01)
(52) U.S. Cl. .................. 257/732; 257/685; 257/777; 257/784; 257/786; 257/E25.006; 257/E21.614; 257/E23.085
(58) Field of Classification Search .................. 257/685, 257/686, 723, 777, 732, 784, 786, 787, E25.006, 257/E25.013, E25.018, E25.021, E25.027, 257/E21.614, E23.085
See application file for complete search history.

(56) References Cited

U.S. PATENT DOCUMENTS

| 5,616,955 | A   | * | 4/1997  | Yamada et al. | 257/690 |
| 6,031,279 | A   |   | 2/2000  | Lenz          | 257/686 |
| 6,351,028 | B1  | * | 2/2002  | Akram         | 257/686 |
| 6,566,749 | B1  | * | 5/2003  | Joshi et al.  | 257/706 |
| 6,697,257 | B1  |   | 2/2004  | Wolf et al.   | 361/708 |
| 6,774,476 | B2  |   | 8/2004  | Spitz et al.  | 257/686 |
| 7,262,444 | B2  | * | 8/2007  | Fillion et al.| 257/177 |
| 2005/0104183 | A1 | * | 5/2005 | Kuroda et al. | 257/686 |
| 2005/0275082 | A1 | * | 12/2005 | Ferrara et al. | 257/691 |

FOREIGN PATENT DOCUMENTS

| DE | 19635582   | 9/1996 |
| DE | 19950026   | 4/2001 |
| DE | 10009171   | 9/2001 |
| DE | 10157361   | 3/2003 |
| DE | 10301091   | 7/2004 |
| DE | 10339462   | 3/2005 |
| JP | 58095853   | 6/1983 |
| JP | 2005167286 | 6/2005 |
| WO | 02058151   | 7/2002 |

* cited by examiner

*Primary Examiner*—Davienne Monbleau
*Assistant Examiner*—Eduardo A Rodela
(74) *Attorney, Agent, or Firm*—Banner & Witcoff, Ltd.

(57) ABSTRACT

A power semiconductor device has a power field effect transistors connected in a bridge circuit (16), parallel circuit or series circuit (18), the power semiconductor device (30) having a base power semiconductor chip (1) with large-area external contacts (S1, D1) on the top side (31) and rear side (32) and carrying at least one stacked power semiconductor chip (2). The stacked power semiconductor chip (2) is surface-mounted with at least one large-area external electrode (D2) on a correspondingly large-area external electrode (S1) of the top side (31) of the base power semiconductor chip (1). At least one metallic structured spacer (33) is arranged between the surface-mounted external electrodes (S1, D2) of the base power semiconductor chip (1) and the stacked power semiconductor chip (2). The structure of the spacer (33) has at least one cutout (34) for a non-surface-mountable connecting element (35) of the base power semiconductor chip (1).

29 Claims, 4 Drawing Sheets

POWER SEMICONDUCTOR DEVICE COMPRISING A SEMICONDUCTOR CHIP STACK AND METHOD FOR PRODUCING THE SAME

CROSS-REFERENCE TO RELATED APPLICATIONS

This application claims priority from German Patent Application No. 10 2005 039 478.7, which was filed on Aug. 18, 2005, and is incorporated herein by reference in its entirety.

TECHNICAL FIELD

The invention relates to a power semiconductor device comprising a semiconductor chip stack and a method for producing the same. In particular, the invention relates to a power semiconductor device comprising power field effect transistors connected in a bridge circuit, parallel circuit or series circuit, the power semiconductor device having a base power semiconductor chip with large-area external electrodes on the top side and rear side and carrying at least one stacked power semiconductor chip that is surface-mounted with at least one large-area external electrode on a correspondingly large-area external electrode of the top side of the base power semiconductor chip.

BACKGROUND

The document DE 101 57 361 discloses an electronic device comprising a stack of semiconductor chips, an intermediate carrier being arranged as spacer between the stacked semiconductor chips in order to ensure that the interspace between the stacked semiconductor chips is sufficient, so that bonding connections of a base chip are not damaged by the stacked semiconductor chip projecting beyond the base chip. The known electronic device involves stacking semiconductor chips which have a multiplicity of contact areas in their edge regions which are electrically connected to corresponding external contacts of the electronic device via the bonding connections. The spacer having an insulating effect is accordingly intended to ensure that a plastics composition having an insulating effect fills the interspace between the stacked semiconductor chips in such a way that the edges of the stacked semiconductor chip that project beyond the base chip are supported. One disadvantage of a spacer of this type is that it can only perform mechanical functions, and is unsuitable for the coupling and forwarding of currents and signals.

The document DE 196 35 582 C1 discloses a power semiconductor component for bridge circuits comprising so-called high-side switches or low-side switches, which has a first base power semiconductor chip containing a vertical first transistor, and a further, second power semiconductor chip having a second vertical transistor is mounted on the first base power semiconductor chip, so that the conduction paths of the two transistors are connected in series. An arrangement of this type can be extended in a simple manner to form a full bridge, as shown in FIGS. 6 and 7.

Figure 6:
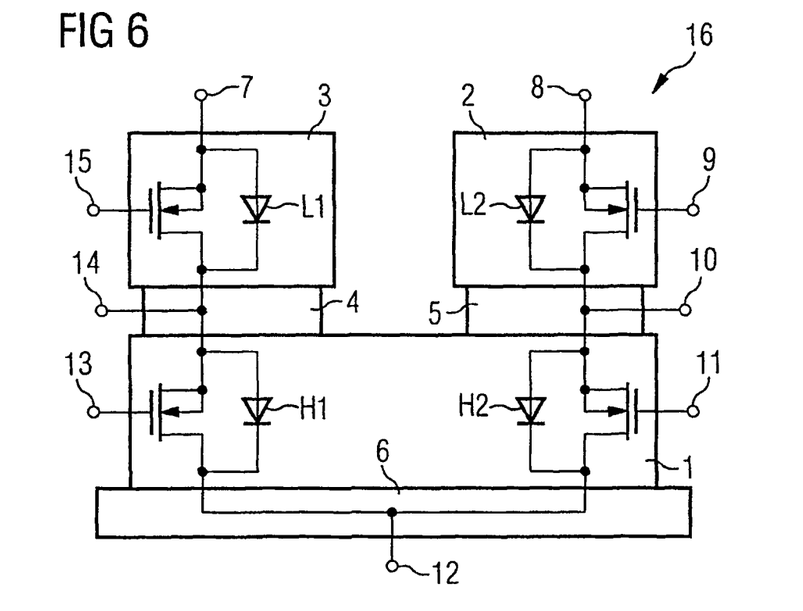
FIG. 6 shows a basic schematic diagram of an H bridge circuit in accordance with the prior art.

FIG. 6 shows the bridge circuit of power semiconductor chips known from the prior art, the base power semiconductor chip 1 being mounted on a so-called heat sink area 6 and containing two semiconductor switches H1, H2 insulated from one another on the source side. The two drain connections of the semiconductor switches H1 and H2 form the rear side of the base power semiconductor chip 1, said rear side being mounted on the heat sink area 6. Two further power semiconductor chips 2 and 3 are then stacked on the source areas of the two transistors H1 and H2, said source areas being situated on the top side of the base power semiconductor chip 1.

These stacked power semiconductor chips 2 and 3 respectively have further power transistors L1 and L2. In this respect, the drain regions of the transistors L1 and L2 are mounted on the respective source regions of the power transistors H1 and H2 and form the nodes 4 and 5, which can be connected via the respective external connections 10 and 14. The respective source regions of the power transistors L1 and L2 can likewise be contact-connected via the external connections 7 and 8 by bonding. The external connections 9, 11, 13 and 15 serve for driving the respective transistors H1, H2, L1 and L2 of the full bridge.

Figure 7:
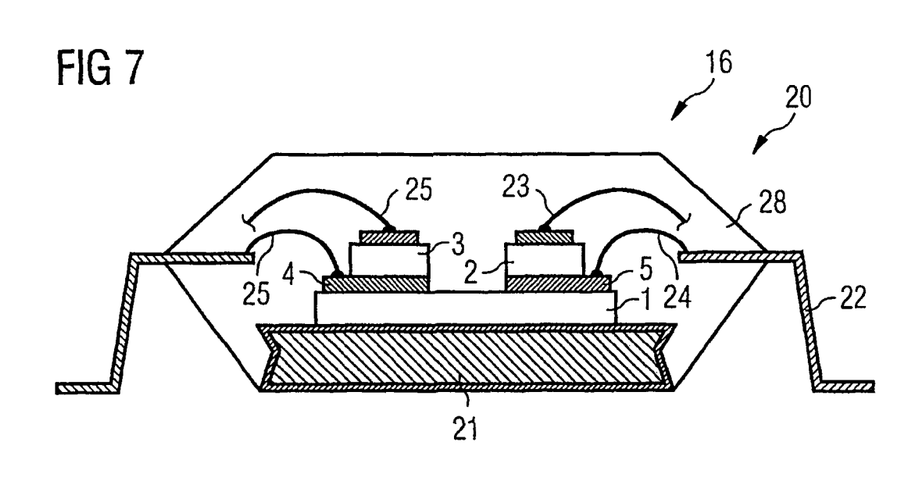
FIG. 7 shows a schematic cross section through a surface-mountable housing with the bridge circuit in accordance with FIG. 6.

One realization of the bridge circuit 16 is shown in FIG. 7, in which the bridge circuit 16 is arranged in a surface-mountable housing 20 with external connections 22. In this case, the two source areas of the transistors H1 and H2 situated at the surface of the base power semiconductor chip 1 are larger than the second and third stacked power semiconductor chips 2 and 3 mounted on them. As a result, contact can be made by the contact-making areas at the nodes 4 and 5 in a simple manner by means of bonding wires 24 and 26 with the external connections 22. The source areas of the semiconductor chips 2 and 3 are also likewise connected to respective externally accessible connections 22 from above by means of bonding wires 23 and 25.

This arrangement has the disadvantage that the drain connection basic area of the low-side switches L1 and L2 contained in the power semiconductor chips 2 and 3 is smaller than the respective source contact-making areas of the high-side switches H1 and H2 in the base power semiconductor chip 1. This is associated with the disadvantage that the permissible current consumption of the bridge circuit branches is significantly restricted by the reduced size of the stacked power semiconductor components 2 and 3.

SUMMARY

A power semiconductor device may have a base power semiconductor chip with large-area external electrodes on a top side and rear side and carrying at least one stacked power semiconductor chip that is surface-mounted with at least one large-area external electrode on a correspondingly large-area external electrode of the top side of the base power semiconductor chip, at least one metallic structured spacer being arranged between the surface-mounted external electrodes of the base power semiconductor chip and the stacked power semiconductor chip, the structure of said spacer comprising at least one cutout for a non-surface-mountable connecting element of the base power semiconductor chip.

BRIEF DESCRIPTION OF THE DRAWINGS

The invention will now be explained in more detail with reference to the accompanying figures.

DETAILED DESCRIPTION

As stated above a power semiconductor device may have a semiconductor chip stack, in particular comprising power field effect transistors connected in a bridge circuit, parallel circuit or series circuit. For this purpose, the power semiconductor device may have a base power semiconductor chip with large-area external electrodes on its top side and its rear side. Furthermore, the power semiconductor device may have at least one stacked power semiconductor chip which is carried by the base power semiconductor chip and is surface-mounted with at least one large-area external electrode on a correspondingly large-area external electrode of the base power semiconductor chip. For this purpose, at least one metallic, structured spacer can be arranged between the surface-mounted external electrodes of the base power semiconductor chip and the stacked power semiconductor chip. The structure of the spacer may have at least one cutout for a non-surface-mountable connecting element of the base power semiconductor chip.

Such a power semiconductor device comprising a semiconductor chip stack may have the advantage that, for example in the case of bridge circuits, the stacked power semiconductor devices are no longer limited in their size. Moreover, the spacer according to the embodiments can make it possible to overcome the restriction known from the document DE 196 35 582 that a bridge arrangement of this type is subject to the applicable condition that the drain connection basic area of the low-side transistors contained in the power semiconductor chips 2 and 3 has to be smaller than the respective source contact-making areas of the high-side switches H1 and H2 in the base power semiconductor chip 1. This restrictive condition can be overcome by means of the metallic and patterned spacer according to the embodiments, so that the size of the low-side power transistors can be adapted to the size of the high-side power transistors in the base power semiconductor chip 1 and a correspondingly increased permissible current consumption is possible in conjunction with otherwise unchanged external dimensions of the power semiconductor device.

In one embodiment, the underside of the spacer can be adapted in terms of its contour and its areal extent to a large-area external electrode on the top side of the base power semiconductor chip. The underside of the spacer, thus, may virtually completely cover such a large-area electrode of the base power semiconductor chip, apart from the abovementioned cutout for a non-surface-mountable connecting element. Consequently, the underside of the spacer can be cohesively connected to a large-area external electrode on the top side of the base power semiconductor chip, for which purpose a diffusion soldering method is preferably used.

It is furthermore provided that the top side of the spacer, independently of the large-area external electrode on the top side of the base power semiconductor chip, can be adapted in terms of its contour and its areal extent to the rear side of the stacked power semiconductor chip. Consequently, it is possible for power semiconductor chips which have a larger areal extent than that of the base power semiconductor chip also to be fitted on the top side of the base power semiconductor device.

In one embodiment, it may be provided that the base power semiconductor chip has a power semiconductor chip with semiconductor structures for an external connection at high supply potential. This base power semiconductor chip thus can correspond to a semiconductor chip comprising high-side transistors that is known from the prior art.

Moreover, it may be provided that the base power semiconductor chip has components of two bridge branches with vertical semiconductor switches, in order to realize an H bridge circuit having an improved permissible current consumption in comparison with conventional H bridge circuits.

In a further embodiment, the stacked power semiconductor chip may have components of two bridge branches with semiconductor structures for an external connection at low supply potential. These stacked power semiconductor chips, thus, may correspond to the low-side transistors from the prior art cited above.

On account of the cutouts provided, different forms may arise for the cross section of the spacer. The spacer preferably may have a T-shaped cross section. In the case of such a T-shaped cross section, at least two non-surface-mountable connecting elements can be mounted in the resulting cutouts. In a further embodiment, the spacer may have an L-shaped cross section for only one individual non-surface-mountable connecting element. It is furthermore provided that the spacer may project beyond the base power semiconductor chip. A power semiconductor device of this type may have the advantage that it is possible to realize semiconductor chip stacks which have a control chip or a memory chip with signal processing as stacked semiconductor chips.

The spacer may preferably comprise copper, iron, silver or alloys thereof. These metallic materials may have the advantage that not only is an electrically conductive connection created, but also a thermal coupling occurs between base power semiconductor chip and stacked power semiconductor chip, so that, for the spacer and the base power semiconductor chip, heat loss can be dissipated toward the outside via the underside of the base power semiconductor chip.

In one embodiment, the metallic spacer with cutouts can be formed as a contact element in such a way that it merges into a mounting clip and additionally produces an electrical connection to contact pads of a circuit carrier.

Preferably, diffusion solder layers with intermetallic phases, preferably from the group CuSn, AgSn or AuSn can be arranged between the surface-mounted large-area external electrodes and the top side and/or the underside of the spacer. This may have the advantage that the intermetallic phases give rise to a diffusion solder layer which is not resolved even when, by way of example, the power semiconductor device is to be soldered onto a superordinate circuit board, since the temperatures of such soldering processes are lower than the melting points of the different intermetallic phases from the group specified above.

In a further embodiment, the power semiconductor device may have surface-mountable mounting clips between and/or on the semiconductor chip stack. Such mounting clips may have the advantage that they can be connected over a large area and cohesively to the different large-area external electrodes of the semiconductor chips and can connect a connection between the large-area external electrodes of the power semiconductor chips of the semiconductor chip stack to correspondingly large-area contact pads of a circuit carrier. Consequently, higher currents for the power semiconductor devices can be fed in and out via such mounting clips than via bonding wires.

In a further embodiment, the power semiconductor device may have a base power semiconductor chip with a large-area external electrode on the underside as drain electrode and, on the top side, two large-area source electrodes insulated from one another. Moreover, two gate electrodes can be arranged on the top side and can be electrically connected as non-surface-mountable external electrodes to the circuit carrier via bonding wires. Such a base power semiconductor chip may correspond to the base power semiconductor chip for an H bridge circuit that is known from the prior art.

However, this base power semiconductor chip may have, on the two electrodes of the top side of the base power semiconductor device, two correspondingly areally adapted spacers having, on their top sides, two semiconductor power chips to be stacked which may have a larger external electrode than is possible for the known bridge circuit. This may have the advantage that the permissible current consumption of the low-side transistors and the high-side transistors in this bridge circuit can be adapted to one another.

To summarize, it can be stated that with the aid of the electrically conductive spacers proposed here, the intermediate plane between the semiconductor chips stacked one on top of another can be contact-connected without influencing the size of the stacked power semiconductor chip since the region above the non-surface-mountable bonding wires is now available also for fitting the stacked semiconductor power chip. Consequently, the electrically conductive spacers in the intermediate plane make it possible that for chip-on-chip mounting, in particular for power field effect transistors connected in a bridge circuit, the size of the stacked power semiconductor chips that can be used can be varied as desired.

A method for producing a power semiconductor device comprising a semiconductor chip stack may have the following method steps. The first involves producing a base power semiconductor chip and a power semiconductor chip to be stacked thereon having large-area external electrodes on their top sides and rear sides. A metallic spacer is furthermore produced, the structure of which has cutouts for non-surface-mountable connecting elements. The base power semiconductor chip is then mounted onto a circuit carrier and non-surface-mountable connecting elements between the base power semiconductor chip and the circuit carrier are fitted to the base power semiconductor chip.

The semiconductor chip stack comprising power semiconductor chips can be produced by means of orienting the spacer with cutouts for non-surface-mountable connecting elements on the base power semiconductor chip on a large-area external electrode of the base power semiconductor chip and applying the power semiconductor chip to be stacked on the spacer. Diffusion soldering is subsequently carried out in order to cohesively connect this stack comprising base power semiconductor chip, spacer and stacked power semiconductor chip on a circuit carrier. Finally, the semiconductor chip stack is then embedded together with connecting elements and also portions of the circuit carrier in a plastic housing composition to form a power semiconductor device.

A method of this type may have the advantage that it is thereby possible to produce half bridges and full bridges by chip-on-chip mounting (CoC) and full bridges which are realized by means of an electrically conductive spacer. Said spacer made of material having good electrical and thermal conductivity, such as copper, iron and/or silver, provides not only the possibility of electrical connection but also good thermal linking. Diffusion soldering, for example by means of CuSn, AgSn or AuSn, has the advantage that this enables a multiple "die bonding process" without reflow melting of the preceding diffusion solder connection and it is thereby possible to produce reproducible joining gap thicknesses. The spacer may have a wide variety of structures and forms for this purpose and may be formed in rectangular, T-shaped or L-shaped fashion in its cross section in order to achieve the maximum possible area for the stacked power semiconductor chip, the stacked power semiconductor chip also being available to project beyond the spacer.

Preferably, mounting clips for connecting large-area external electrodes to the circuit carrier can be fitted on the top side of the base power semiconductor chip and/or on the top side of the stacked power semiconductor chip. The combination of mounting clip and spacer may make it possible to bridge any desired number of non-surface-mountable control and signal bonding wires with the aid of a metal clip. Consequently, the base power semiconductor chip and/or the stacked semiconductor chip could also have semiconductor chip structures which fulfill control, logic and/or memory functions besides the power switching functions.

In one implementation of the method, the application of the base power semiconductor chip to a circuit carrier can be effected by means of soldering technology, preferably by means of diffusion soldering. The advantages of diffusion soldering for a power semiconductor of this type have already been discussed above.

Bonding wire connecting techniques may preferably be used for fitting non-surface-mountable connecting elements between the base power semiconductor chip and the circuit carrier. The bonding wire connecting techniques require correspondingly large cutouts in the spacer in order to ensure that bonding arcs are not damaged during the mounting of the stacked power semiconductor chip.

Figure 1:
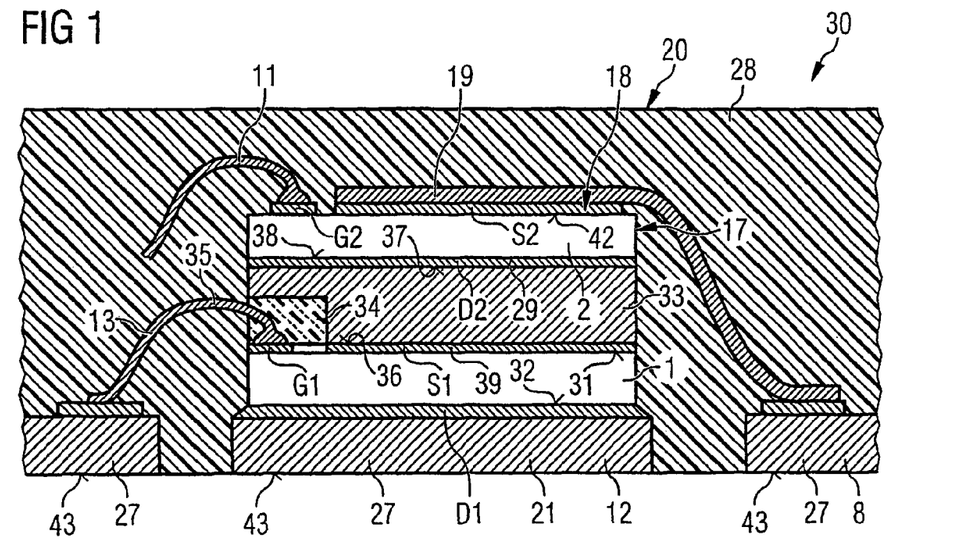
FIG. 1 shows a schematic cross section through a power semiconductor device of a first embodiment.

FIG. 1 shows a schematic cross section through a power semiconductor device 30 of a first embodiment. The components of the power semiconductor device 30 are embedded in a plastic housing composition 28, surface-mountable external contact areas 43 of a circuit carrier 27 being arranged on the underside of the power semiconductor device 30. A base power semiconductor chip 1 is arranged by its rear side 32 on a receptacle device 21 of the circuit carrier 27, a large-area drain electrode D1 for a drain connection 12 for a high supply potential being provided on the rear side 32. The drain electrode D1 is applied on the receptacle device 21, which may also be a heat sink, by means of diffusion soldering. A non-surface-mountable gate electrode G1 and a large-area and surface-mountable source electrode S1 are arranged on the top side 31 of the base power semiconductor chip 1.

While the gate electrode G1 is connected to a corresponding surface-mountable external contact area 43 of the circuit carrier 27 via a non-surface-mountable connecting element 35 in the form of a bonding wire 13, a metallic, structured spacer 33 is surface-mounted on the source electrode S1, said spacer having a cutout 34 for the non-surface-mountable connecting element 35. Said cutout 34 may be limited to a small volume element, so that precisely only the bonding wire 13 with its bonding wire arc reaches the top side 31 of the base power semiconductor chip 1 without touching the metallic spacer 33. The cohesive connection between the source electrode S1 and the underside 36 of the spacer 33 has a diffusion solder layer 39.

The cutout 34 in the spacer advantageously makes it possible for the top side 37 of the spacer to project beyond the bonding wire 13 in terms of its areal extent and, consequently, to be able to receive a large-area stacked power semiconductor chip 2. Said stacked power semiconductor chip 2 has a drain electrode D2 on its rear side 38, said drain electrode being cohesively connected to the top side 37 of the spacer 33 via a diffusion solder layer 29.

The top side 42 of the stacked power semiconductor chip 2 likewise has a non-surface-mountable gate electrode G2 connected to the circuit carrier 27 via a further bonding connection 11, while the large-area source electrode S2 situated on the top side 42 of the stacked power semiconductor chip 2 is electrically connected to the circuit carrier 27 via a mounting clip 19. The mounting clip 19 has the advantage that it is surface-mountable and is configured as a metal strip in such a way that it projects beyond the edge of the semiconductor chip stack 17 and can be bent away in the direction of the circuit carrier 27.

This semiconductor chip stack 17 has the advantage that the stacked power semiconductor chip 2, in terms of its areal extent, can take up at least the same area as the base power semiconductor chip 1. Consequently, through a bridge half branch of this type, a current can be conducted which loads the two stacked power semiconductor chips in the same way since the structure of the spacer 33 enables a larger semiconductor power chip to be fixed on its top side 37 than would be permitted by the area of the source electrode S1 of the base power semiconductor chip 1. This bridge half branch realizes a series circuit 18 formed by two power semiconductor chips in a semiconductor chip stack 17.

Figure 2:
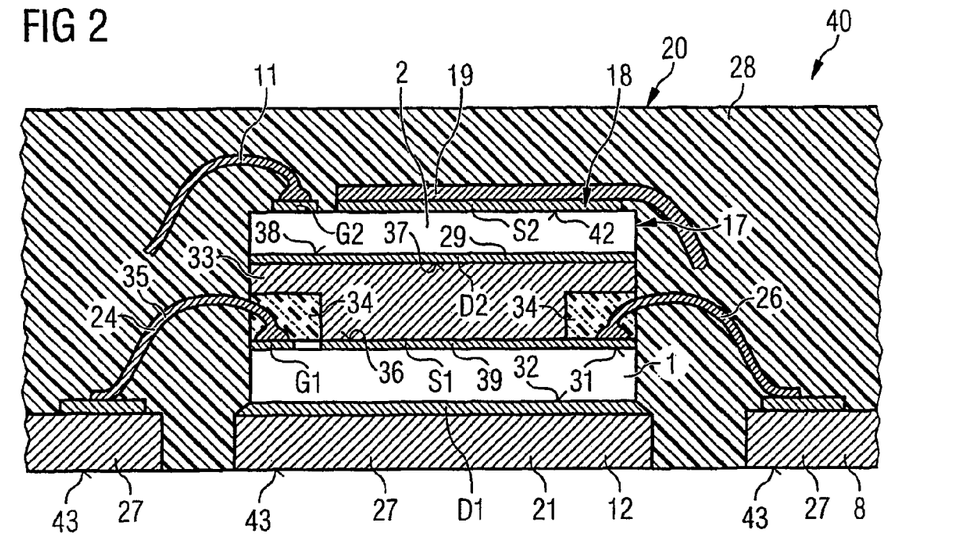
FIG. 2 shows a schematic cross section through a power semiconductor device of a second embodiment.

FIG. 2 shows a schematic cross section through a power semiconductor device 40 of a second embodiment. In this power semiconductor device 40, a surface-mountable housing 20 with surface-mountable external contact areas 43 is created from a plastic housing composition 28, the plastic housing composition 28 embedding a semiconductor stack 17 having a base power semiconductor device 1 and a stacked power semiconductor device 2 with a T-shaped spacer 33 arranged in between. Components having functions identical to those in FIG. 1 are identified by the same reference symbols and are not discussed separately.

The T-shaped spacer 33 has two cutouts 34 provided firstly for a non-surface-mountable connecting element 35 of a gate electrode G1 and secondly for fitting a bonding wire 26, which is arranged in addition to the T-shaped spacer 33 on the source electrode S1 of the base power semiconductor chip 1 and is electrically connected to an external connection 8 of the circuit carrier 27.

Figure 3:
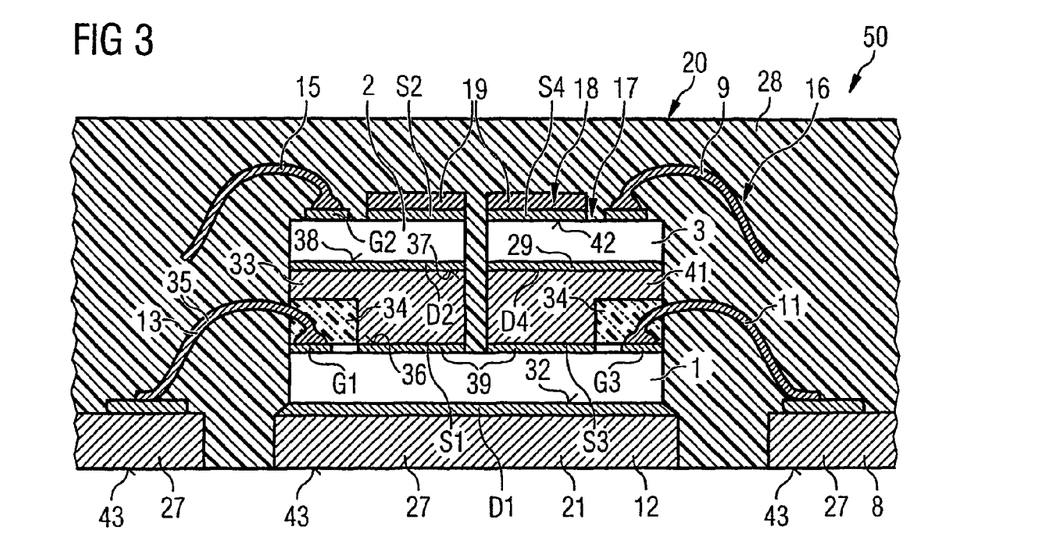
FIG. 3 shows a schematic cross section through a power semiconductor device of a third embodiment.

FIG. 3 shows a schematic cross section through a power semiconductor device 50 of a third embodiment. Components having functions identical to those in the previous figures are identified by the same reference symbols and are not discussed separately. In this third embodiment, the base power semiconductor chip 1 has two power transistors which have a common drain electrode D1 and, on the top side 31, two separate gate electrodes G1 and G3 connected to the circuit carrier 27 via bonding connections 13 and 11.

Moreover, the top side 31 of the base power semiconductor chip 1 has two electrically isolated, large-area source electrodes S1 and S3, on which are arranged L-shaped spacers 33 and 41, respectively, in order to receive corresponding stacked power semiconductor chips 2 and 3, respectively, so that a complete H bridge circuit can be fashioned with this power semiconductor device 50. The source electrodes S2 and S4 are once again connected to the circuit carrier 27 via mounting clips 19, while the gate electrodes G2 and G4, respectively, make contact with the circuit carrier 27 via the bonding connections 15 and 9. On account of the L-shaped spacers 33 and 41, correspondingly large-area power semiconductor chips 2 and 3 can be stacked on the base power semiconductor chip 1 which correspond in terms of their size and current-carrying capacity to the two power transistors of the bridge circuit 16 that are structured in the base power semiconductor chip 1.

Figure 4:
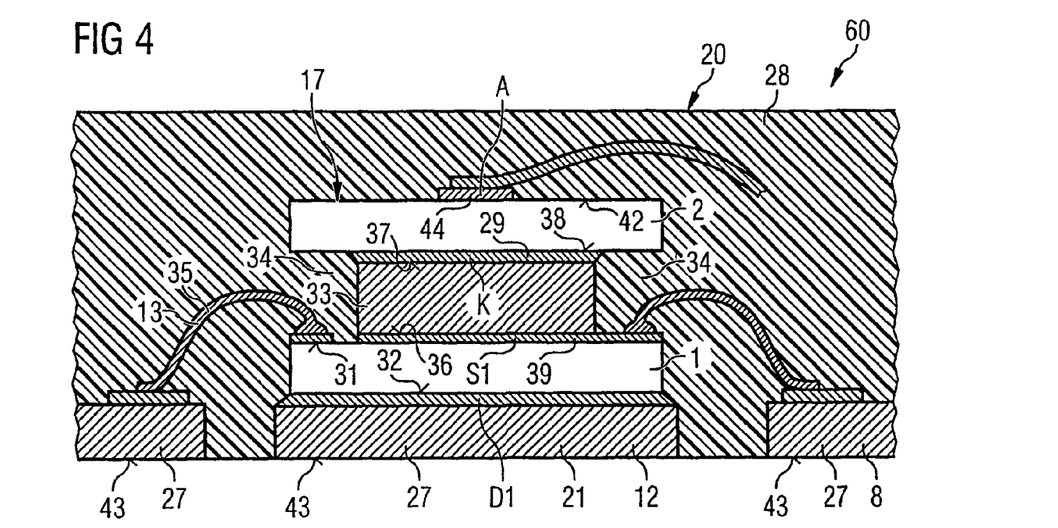
FIG. 4 shows a schematic cross section through a power semiconductor device in accordance with a fourth embodiment.

FIG. 4 shows a schematic cross section through a power semiconductor device 60 in accordance with a fourth embodiment. In the case of this power semiconductor device 60, a mounting clip connection has been dispensed with, and the connection has been realized by means of corresponding bonding wires. Components having functions identical to those in the previous figures are identified by the same reference symbols and are not discussed separately. In this embodiment, the stacked power semiconductor chip 2 projects beyond the top side 37 of the spacer 33 without the stacked power semiconductor chip 2 being damaged during mounting or during application of the bonding connections. This is possible only by virtue of the fact that large-area contact areas 44 are arranged centrally on the top side 42 of the stacked power semiconductor chip 2 in the central region, so that they can be supported by the centrally arranged spacer 33 during bonding.

Figure 5:
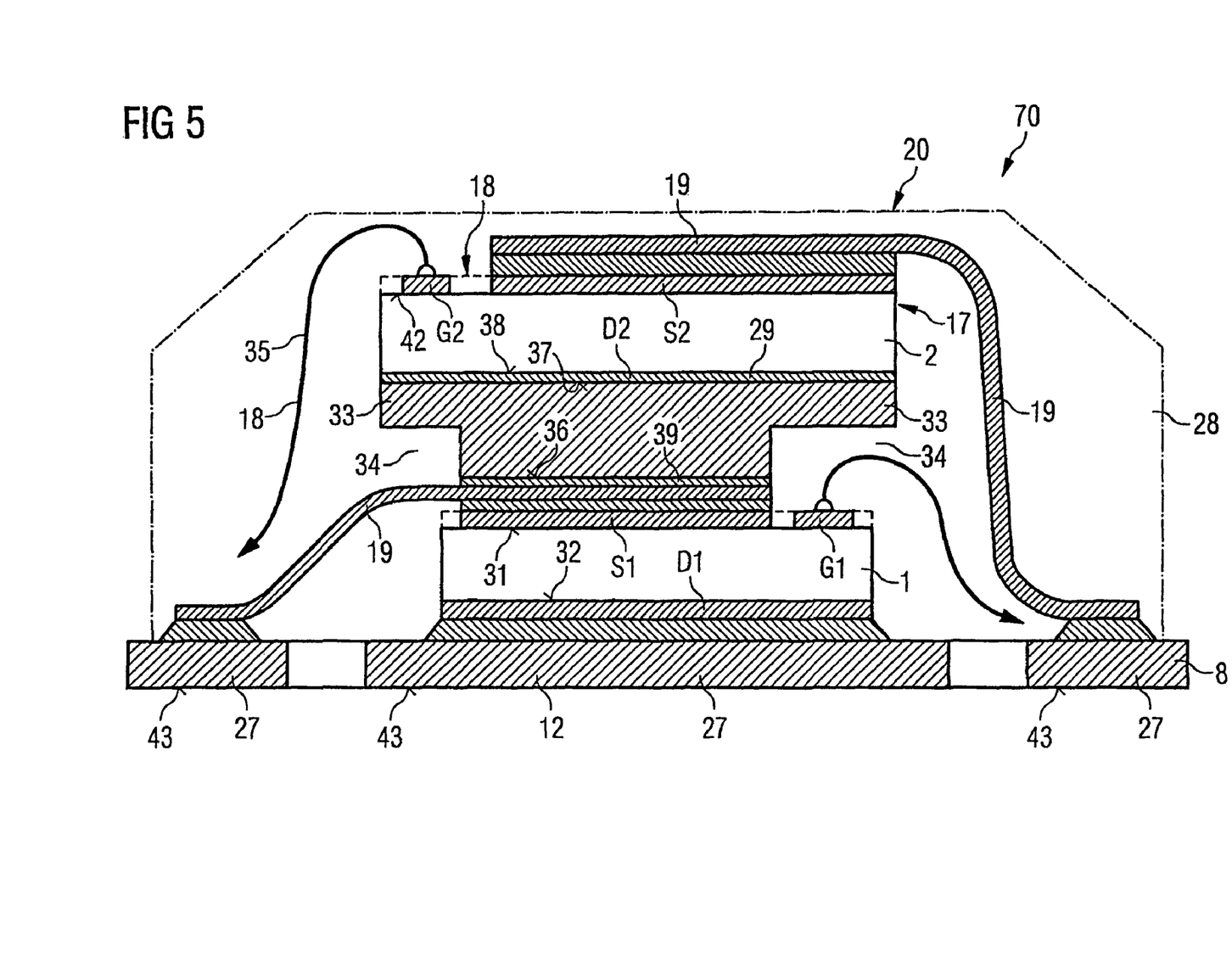
FIG. 5 shows a schematic cross section through a power semiconductor device in accordance with a fifth embodiment.

FIG. 5 shows a schematic cross section of a power semiconductor device 70 in accordance with a fifth embodiment. The components having functions identical to those in the previous figures are identified by the same reference symbols and are not discussed separately. This embodiment differs from the previous embodiments by the fact that mounting clips 19 are arranged both on the top side of the semiconductor chip stack 17 and in the intermediate region of the semiconductor chip stack 17, in order firstly to connect the large-area source electrode S1 of the base power semiconductor chip 1 to the circuit carrier 27 and secondly to couple the large-area source electrode S2 of the stacked power semiconductor chip 2 to a corresponding region of the circuit carrier 27 via a mounting clip 19.

This fifth embodiment furthermore differs from the previous embodiments by the fact that the T-shaped spacer 33 projects beyond the base power semiconductor chip 1 and simultaneously carries a stacked power semiconductor chip 2 adapted to this size. This T-shaped spacer 33 ensures that the gate electrode G2 is supported when the surface-mountable connecting element 35 is bonded on, and no microcracks are induced in the stacked power semiconductor chip 2.

LIST OF REFERENCE SYMBOLS

1 Base power semiconductor chip
2 Stacked power semiconductor chip
3 Stacked power semiconductor chip
4 Node
5 Node
6 Heat sink area
7 External connection
8 External connection
9 Bonding connection
10 External connection
11 Bonding connection
12 Drain external connection at high supply potential
13 Bonding connection
14 External connection
15 Bonding connection
16 Bridge circuit
17 Semiconductor chip stack
18 Series circuit
19 Mounting clip
20 Surface-mountable housing
21 Receptacle device (or heat sink)
22 External connection 23 Bonding wire
24 Bonding wire
25 Bonding wire
26 Bonding wire
27 Circuit carrier
28 Plastic housing composition
29 Diffusion solder layer
30 Power semiconductor device comprising semiconductor chip stack (first embodiment)
31 Top side of the base power semiconductor chip
32 Rear side of the base power semiconductor chip
33 Spacer
34 Cutout
35 Non-surface-mountable connecting element
36 Underside of the spacer
37 Top side of the spacer
38 Rear side of the stacked power semiconductor chip
39 Diffusion solder layer
40 Power semiconductor device comprising semiconductor chip stack (second embodiment)
41 Spacer
42 Top side of the stacked power semiconductor chip
43 Surface-mountable external contact areas
44 Large-area contact areas
50 Power semiconductor device comprising semiconductor chip stack (third embodiment)
60 Power semiconductor device comprising semiconductor chip stack (fourth embodiment)
70 Power semiconductor device comprising semiconductor chip stack (fifth embodiment)
D1 Drain electrode
D2 Drain electrode
D4 Drain electrode
G1 Gate electrode
G2 Gate electrode
G3 Gate electrode
G4 Gate electrode
H1 Power transistor (high-side switch)
H2 Power transistor (high-side switch)
L1 Power transistor (low-side switch)
L2 Power transistor (low-side switch)
S1 Source electrode
S2 Source electrode
S3 Source electrode
S4 Source electrode

What is claimed is:

1. A power semiconductor device comprising a semiconductor chip stack with power field effect transistors connected in a bridge circuit, parallel circuit or series circuit, the power semiconductor device comprising a base power semiconductor chip with a first large-area external electrode on each of a top side and rear side, the base power semiconductor chip carrying a first stacked power semiconductor chip that is surface-mounted with a first large-area external electrode on the first large-area external electrode of the top side of the base power semiconductor chip, a first metallic structured spacer being arranged between the base power semiconductor chip and the first stacked power semiconductor chip, the first metallic structured spacer electrically connecting the first large-area external electrode on the top side of the base power semiconductor chip with the first large-area external electrode of the first stacked power semiconductor chip, the structure of said first metallic structured spacer comprising at least one cutout for a non-surface-mountable connecting element of the base power semiconductor chip, wherein a drain electrode is arranged as a large-area external electrode on the rear side of the base power semiconductor chip and two source electrodes are arranged on the top side of the base semiconductor chip, the top side of the base semiconductor chip, the top side of the base semiconductor chip having two gate electrodes that are electrically connected as non-surface-mountable external electrodes to a circuit carrier via bonding wires.

2. The power semiconductor device according to claim 1, wherein the underside of the first metallic structured spacer is adapted in terms of its contour and its areal extent to the large-area external electrode on the top side of the base semiconductor power chip taking account of the space requirement of a non-surface-mountable connecting element.

3. The power semiconductor device according to claim 1, wherein a top side of the first metallic structured spacer, independently of the large-area external electrode on the top side of the base semiconductor power chip, is adapted in terms of its contour and its areal extent to the rear side of the first stacked power semiconductor chip.

4. The power semiconductor device according to claim 1, wherein the base power semiconductor chip comprises a power semiconductor chip with semiconductor structures for an external connection at high supply potential.

5. The power semiconductor device according to claim 1, wherein the base power semiconductor chip comprises a half-bridge circuit that comprises two bridge branches with vertical semiconductor switches.

6. The power semiconductor device according to claim 1, wherein the first stacked power semiconductor chip comprises a full bridge circuit that comprises two bridge branches with semiconductor structures for an external connection at low supply potential.

7. The power semiconductor device according to claim 1, wherein the spacer has a T- or L-shaped cross section.

8. The power semiconductor device according to claim 1, wherein the first metallic structured spacer comprises copper, iron, silver or alloys thereof.

9. The power semiconductor device according to claim 1, wherein diffusion solder layers with intermetallic phases of the group CuSn, AgSn or AuSn are arranged between the surface-mounted large-area external electrodes and the top side and/or the underside of the first metallic structured spacer.

10. The power semiconductor device of claim 1, wherein the first metallic structured spacer forms part of said bridge circuit, parallel circuit or series circuit.

11. The power semiconductor device of claim 1, wherein the base power semiconductor chip comprises high-side transistors.

12. The power semiconductor device of claim 1, wherein the first stacked power semiconductor chip comprises low-side transistors.

13. The power semiconductor device of claim 1, wherein the base power semiconductor chip further carries a second stacked power semiconductor chip that is surface-mounted with a first large-area external electrode on the top side of the base power semiconductor chip.

14. The power semiconductor device of claim 13, further comprising a second metallic structured spacer electrically connecting one of the electrodes of the base power semiconductor chip with the first large-area external electrode of the second stacked power semiconductor chip.

15. The power semiconductor device of claim 14, wherein the first and second metallic structure spacers are electrically isolated from each other.

16. The power semiconductor device of claim 1, wherein a surface area of the first metallic structured spacer that faces the first large-area external electrode on the top side of the base power semiconductor chip is smaller than an area of the first large-area external electrode on the top side of the base power semiconductor chip.

17. A power semiconductor device comprising a semiconductor chip stack with power field effect transistors connected in a bridge circuit, parallel circuit or series circuit, the power semiconductor device comprising a base power semiconductor chip with large-area external electrodes on a top side and rear side and carrying at least one stacked power semiconductor chip that is surface-mounted with at least one large-area external electrode on a correspondingly large-area external electrode of the top side of the base power semiconductor chip, at least one metallic structured spacer being arranged between the surface-mounted external electrode on the top side of the base power semiconductor chip and the surface-mounted external electrode of the stacked power semiconductor chip, the structure of said spacer comprising at least one cutout for a non-surface-mountable connecting element of the base power semiconductor chip, wherein a drain electrode is arranged as a large-area external electrode on the rear side of the base power semiconductor chip and two source electrodes are arranged on the top side of the base semiconductor chip, the top side of the base semiconductor chip having two gate electrodes that which are electrically connected as non-surface-mountable external electrodes to a circuit carrier via bonding wires.

18. The power semiconductor device according to claim 17, wherein on the two source electrodes of the base power semiconductor device, the large-area external electrodes of two power semiconductor chips to be stacked are arranged with their large-area drain electrodes on two corresponding spacers.

19. The power semiconductor device of claim 17, wherein a surface area of the at least one metallic structured spacer that faces the large-area external electrode on the top side of the base power semiconductor chip is smaller than an area of the large-area external electrode on the top side of the base power semiconductor chip.

20. A power semiconductor device connected in a bridge circuit, parallel circuit or series circuit and comprising a base power semiconductor chip with large-area external electrodes on a top side and rear side and carrying at least one stacked power semiconductor chip that is surface-mounted with at least one large-area external electrode on the large-area external electrode of the top side of the base power semiconductor chip, at least one metallic structured spacer being arranged between and electrically connecting together the surface-mounted external electrodes of the base power semiconductor chip and of the top side of the stacked power semiconductor chip, the structure of said spacer comprising at least one cutout for a non-surface-mountable connecting element of the base power semiconductor chip, wherein a drain electrode is arranged as a large-area external electrode on the rear side of the base power semiconductor chip and two source electrodes are arranged on the top side of the base semiconductor chip, the top side of the base semiconductor chip having two gate electrodes that are electrically connected as non-surface-mountable external electrodes to a circuit carrier via bonding wires.

21. The power semiconductor device of claim 20, wherein the base power semiconductor chip comprises high-side transistors.

22. The power semiconductor device of claim 20, wherein the at least one stacked power semiconductor chip comprises low-side transistors.

23. The power semiconductor device of claim 20, wherein a surface area of the at least one metallic structured spacer that faces the large-area external electrode on the top side of the base power semiconductor chip is smaller than an area of the large-area external electrode on the top side of the base power semiconductor chip.

24. A power semiconductor device connected in a bridge circuit, parallel circuit or series circuit, the power semiconductor device comprising:
    a first power semiconductor chip comprising a first external electrode on a first side and a second external electrode on an opposing second side, wherein the first external electrode is a first source electrode and the second external electrode is a drain electrode;
    a first conductive spacer; and
    a second power semiconductor chip comprising a third external electrode, the second power semiconductor chip being surface-mounted to the first external electrode via the first conductive spacer, wherein the first conductive spacer is arranged between and electrically connects together the first and third electrodes, the first conductive spacer being shaped so as to have a cutout adjacent to the first power semiconductor chip;
    a second source electrode arranged on the first side of the base semiconductor chip; and
    two gate electrodes arranged on the first side of the base semiconductor chip and electrically connected as non-surface-mountable external electrodes to a circuit carrier via bonding wires.

25. The power semiconductor device of claim 24, wherein the third electrode is larger than the first electrode.

26. The power semiconductor device of claim 24, wherein the at least one of the gate electrodes is exposed by the cutout and that is not electrically contacting the conductive spacer.

27. The power semiconductor device of claim 24, further comprising a second conductive spacer and a third power semiconductor chip, wherein the third power semiconductor chip further comprises a fourth external electrode, the third power semiconductor chip is surface-mounted to the second source electrode via the second conductive spacer, the second conductive spacer is arranged between and electrically connects together the fourth electrode and the second gate electrode, and the second conductive spacer is shaped so as to have a cutout adjacent to the first power semiconductor chip.

28. The power semiconductor device of claim 27, wherein the first and second conductive spacers are electrically isolated from each other.

29. The power semiconductor device of claim 24, wherein a surface area of the conductive spacer that faces the first electrode is smaller than an area of the first electrode.

* * * * *

UNITED STATES PATENT AND TRADEMARK OFFICE
CERTIFICATE OF CORRECTION

| | |
|---|---|
| PATENT NO. | : 7,898,080 B2 |
| APPLICATION NO. | : 11/464958 |
| DATED | : March 1, 2011 |
| INVENTOR(S) | : Ralf Otremba |

It is certified that error appears in the above-identified patent and that said Letters Patent is hereby corrected as shown below:

Column 11, Claim 17, Line 24:
Please delete "that which are" and insert -- that are --

Column 12, Claim 24, Line 21:
Please delete "and"

Signed and Sealed this
Eleventh Day of September, 2012

David J. Kappos
*Director of the United States Patent and Trademark Office*